(12) United States Patent
Grodnensky et al.

(10) Patent No.: US 6,750,952 B2
(45) Date of Patent: Jun. 15, 2004

(54) APPARATUS FOR PREFORMING MEASUREMENT OF A DIMENSION OF A TEST MARK FOR SEMICONDUCTOR PROCESSING

(75) Inventors: Ilya Grodnensky, Foster City, CA (US); Kyoichi Suwa, Tokyo (JP); Kazuo Ushida, Tokyo (JP); Eric R. Johnson, Los Gatos, CA (US)

(73) Assignees: Nikon Precision, Inc., Belmont, CA (US); Nikon Corporation, Tokyo (JP)

( * ) Notice: Subject to any disclaimer, the term of this patent is extended or adjusted under 35 U.S.C. 154(b) by 0 days.

(21) Appl. No.: 10/198,701

(22) Filed: Jul. 17, 2002

(65) Prior Publication Data

US 2002/0180948 A1 Dec. 5, 2002

Related U.S. Application Data

(60) Continuation of application No. 09/615,636, filed on Jul. 13, 2000, now Pat. No. 6,449,031, which is a division of application No. 09/163,049, filed on Sep. 29, 1998, now Pat. No. 6,094,256.

(51) Int. Cl.[7] .................... G03B 27/32; G03B 27/68; G03B 27/42
(52) U.S. Cl. .............. 355/77; 355/52; 355/53
(58) Field of Search .............. 355/53, 55, 67–71, 355/77, 52; 356/349–401; 430/5, 20, 30, 311; 250/548

(56) References Cited

U.S. PATENT DOCUMENTS

| | | | |
|---|---|---|---|
| 4,386,849 A | 6/1983 | Haeusler et al. | 356/124 |
| 4,639,142 A | 1/1987 | Chow et al. | 356/372 |
| 4,908,656 A | * 3/1990 | Suwa et al. | 355/53 |
| 4,959,326 A | 9/1990 | Roman et al. | 437/40 |
| 5,111,240 A | 5/1992 | Boettiger | 355/53 |
| 5,140,366 A | 8/1992 | Shiozawa et al. | 355/53 |
| 5,247,329 A | 9/1993 | Oshida et al. | 355/53 |
| 5,256,505 A | 10/1993 | Chen et al. | 430/5 |
| 5,262,822 A | 11/1993 | Kosugi et al. | 355/53 |

(List continued on next page.)

FOREIGN PATENT DOCUMENTS

| | | |
|---|---|---|
| JP | 62-115830 | 5/1987 |
| JP | 62-247525 | 10/1987 |
| JP | 4-209518 | 7/1992 |
| JP | 4-324615 | 11/1992 |
| JP | 5-62882 | 3/1993 |
| JP | 5-217872 | 8/1993 |

OTHER PUBLICATIONS

Kyoichi Suwa et al., "Automatic laser scanning focus detection method using printed focus pattern", SPIE Proceedings Reprint, reprinted from Optical/Laser Microlithography VIII, Feb. 22–24, 1995, 10 pages.

IBM® Technical Disclosure Bulletin, "Multilayer Circuit Fabrication Using Double Exposure Of Positive Resist," ©IBM Corp. 1993, vol. 36, No. 10, Oct. 1993, pp. 423–424.

Christopher J. Progler et al., "Understanding The Effect Of Pitch On Linewidth Control," Olin Microelectronic Materials, Olin Microlithography Seminar, InterFace '96 Proceedings, pp. 141–157.

(List continued on next page.)

Primary Examiner—Henry Hung Nguyen
(74) Attorney, Agent, or Firm—Whitham, Curtis & Christofferson, P.C.

(57) ABSTRACT

Apparatus for performing measurement of a dimension of a test marked formed by overlapping feature imaged onto a an image forming layer of a semiconductor wafer and the calculation of the critical dimensions of the features from test mark. This is used in semiconductor processing. Also included is software configured to program a measurement device to perform the measurement and calculation of the dimension of a test mark.

32 Claims, 7 Drawing Sheets

U.S. PATENT DOCUMENTS

| | | | | |
|---|---|---|---|---|
| 5,300,786 | A | * | 4/1994 | Brunner et al. ............ 250/548 |
| 5,308,741 | A | | 5/1994 | Kemp ......................... 430/312 |
| 5,347,356 | A | * | 9/1994 | Ota et al. .................... 356/363 |
| 5,440,138 | A | | 8/1995 | Nishi .......................... 250/548 |
| 5,573,634 | A | | 11/1996 | Ham ...................... 156/659.11 |
| 5,615,006 | A | | 3/1997 | Hirukawa et al. .......... 356/124 |
| 5,629,772 | A | | 5/1997 | Ausschnitt ................. 356/372 |
| 5,666,205 | A | * | 9/1997 | Tateno et al. ............... 356/401 |
| 5,686,223 | A | | 11/1997 | Cleeves ...................... 430/312 |
| 5,702,868 | A | | 12/1997 | Kellam et al. .............. 430/312 |
| 5,933,239 | A | | 8/1999 | Hoshiyama ................. 356/372 |
| 5,991,006 | A | | 11/1999 | Tsudaka ...................... 355/53 |
| 6,296,977 | B1 | * | 10/2001 | Kaise et al. .................. 430/30 |
| 6,317,211 | B1 | * | 11/2001 | Ausschnitt et al. ......... 356/401 |

OTHER PUBLICATIONS

Alfred K. Wong et al., "Characterization of line width variation", *Proceedings of SPIE vol. 4000* (2000) pp. 184–191.

Richard A. Ferguson et al., "Data analysis methods for evaluating lithographic performance", *J.Vac.Sci.Technol. B 15(6)*, Nov./Dec. 1997, pp. 2387–2393.

Christopher P. Ausschnitt, "Rapid Optimization of the Lithographic Process Window", *SPIE vol. 1088 Optical/Laser Microlithography II* (1989) pp. 115–123.

Alexander Starikov, "Exposure Monitor Structure" *SPIE vol. 1261 Integrated Circuit Metrology, Inspection and Process Control IV* (1990), pp. 315–324.

I. Grodnensky et al., "Technique for optical characterization of exposure tool imaging performance down to 100 nm", *J.Vac.Sci.Technol. B 17(6)*, Nov./Dec. 1999, pp. 3285–3290.

Craig Schneider et al., "Automatic Photolithography Critical Dimension Controls In A Complex, Mixed Technology, Manufacturing Lab", *IEEE/SEMI Advanced Semiconductor Manufacturing Conference*, 2001, pp. 33–40.

T.A. Brunner, "Impace of lens aberrations on optical lithography", *IBM J. Res. Develop. vol. 41, No. 1/2*, Jan./Mar. 1997, 11 pgs.

Gregory J. Kivenzor, "Self–Sustaining Dose Control System: Ways to Improve the Exposure Process", *Proceedings of SPIE vol. 4000* (2000) pp. 835–842.

Christopher P. Ausschnitt et al., "Process window metrology", *Proceedings of SPIE vol. 3998* (2000) pp. 158–166.

Kevin Murray, "Measuring Dimensions Using Murray Daggers*", *Semiconductor International*, Dec. 1982, 4 pgs.

Joseph P. Kirk, "Astigmatism and field curvature from pin–bars", *Proceedings of SPIE vol. 1463, Optical/Laser Microlithography* (1991) pp. 282–291.

William H. Arnold et al., "A focus vernier for optical lithography", *SPIE vol. 1926*, 1993 pp. 380–392.

R.D. Mih et al., "Using the focus monitor test mask to characterize lithographic performance", *SPIE vol. 2440*, 1995 pp. 657–666.

D. Wheeler et al., "Phase Shift Focus Monitor Applications to Lithography Tool Control", *SPIE vol. 3051*, 1997, pp. 225–233.

Terrence E. Zavecz et al., "Critical Dimension Uniformity Prediction and a Method of Discrimination Between Exposure Tool and Process Induced Variation Using Empirical Focal Plane Modeling", Tea Systems Corporation, 1997, pp 155–161.

T.A. Brunner et al., "Simulations and experiments with the phase shift focus monitor", *SPIE vol. 2726*, 1996, pp. 236–243.

T.A. Brunner et al., "Quantitative stepper metrology using the focus monitor test mask", *SPIE vol. 2197*, 1994, pp. 541–549.

Timothy A. Brunner, "New Focus Metrology Technique Using Special Test Mask*", *Microlithography World*, 1994, pp. 5–13.

Hua–Yu Liu et al., "The Application of Alternating Phase–shifting Masks to 140 nm Gate Patterning (II): Mask Design and Manufacturing Tolerances", *SPIE vol. 3334*, 1998, pp. 2–14.

Bhanwar Singh et al., "Linewidth Measurement by Low Voltage SEM",*SPIE vol. 921, Integrated Circuti Metrology, Inspection, and Process Control II*, 1998, pp. 16–21.

Kurt Ronse et al., "CS Control Comparison of Step & Repeat versus Step & Scan DUV Lithography for sub–0.25 $\mu$m gate printing", *Proc. SPIE vol. 3334*, 1998, pp. 56–66.

Jo Finders et al., "Optimizing I–line lithography for 0.3–$\mu$m poly–gate manufacturing", *Solid State Technology, vol. 40, No. 3*, Mar. 1997, pp. S5–6, S8, S10, S14.

S. Sohail H. Naqvi et al., "Diffractive techniques for lithographic process monitoring and control", *J.Vac.Sci.Technol. B 12(6)*, Nov./Dec. 1994, pp. 3600–3606.

Kevin Monhan et al., "Yield Impact of Cross–Field and Cross–Wafer CD Spatial Uniformity: Collapse of the Deep–UV and 193 nm Lithographic Focus Window", *IEEE International Symposium on Semiconductor Manufacturing Conference Proceedings*, 1999, pp. 115–118.

L.M. Milner et al., "Lithographic process monitor using light diffracted from a latent image", *SPIE vol. 1926*, 1993, pp. 94–105.

Joseph P. Kirk, "Review of photoresist based lens evaluation methods", *SPIE vol. 4000*, 2000, pp. 2–8.

William H. Arnold, "Thinking small: challenges for metrology at century's end", *SPIE vol. 3050*, 1997, pp. 2–9.

Kathryn Wilder et al., "Sub–0.35–micron critical dimension metrology using atomic force microscopy", *SPIE vol. 2725*, 1996, pp. 540–554.

S. Jeffrey Rosner et al., "Fourier Analysis Determination of Best Focus in Sub–micron Lithography", *SPIE vol. 2196*, 1994, pp. 314–320.

Raul V. Tan et al., "SMART SET™—An Integrated Approach to Stepper Set–Up and Calibration", *SPIE vol. 565, Micron and Submicron Integrated Circuit Metrology*, 1985, pp. 45–55.

Joseph P. Kirk, "Measurement of astigmatism in microlithographic lenses", *Process SPIE vol. 3334*, 1998, pp. 848–854.

T. A. Brunner et al., "A Stepper Image Monitor for Precise Setup and Characterization", *SPIE vol., 922, Optical/Laser Microlithography*, 1988, pp. 366–375.

T. A. Brunner et al., "In Situ Resolution and Overlay Measurement on a Stepper", *SPIE vol. 565, Micro and Submicron Integrated Circuit Metrology*, 1985, p. 6–13.

J.P. Kirk, "Measuring the aerial image with an atomic force microscope", *Microlithography World*, 1997, pp. 4–9.

J.P. Kirk et al., "Measurement of microlithography aerial image quality", *SPIE vol. 2726*, 1996, pp. 410–416.

* cited by examiner

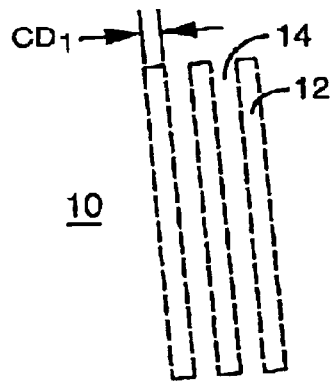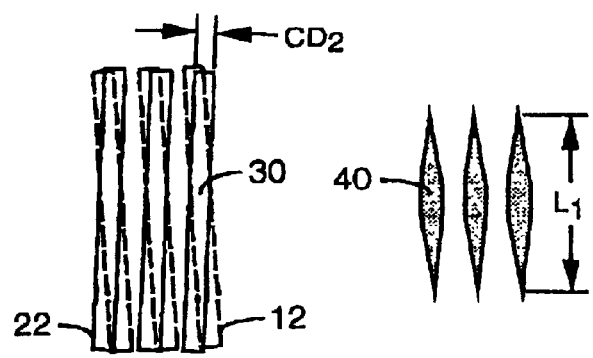
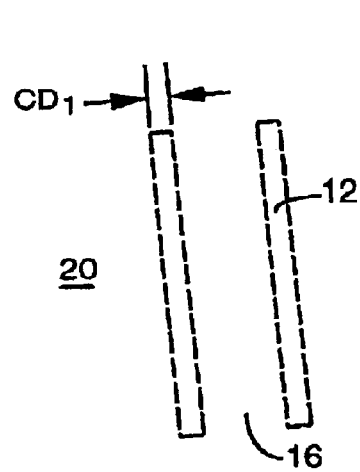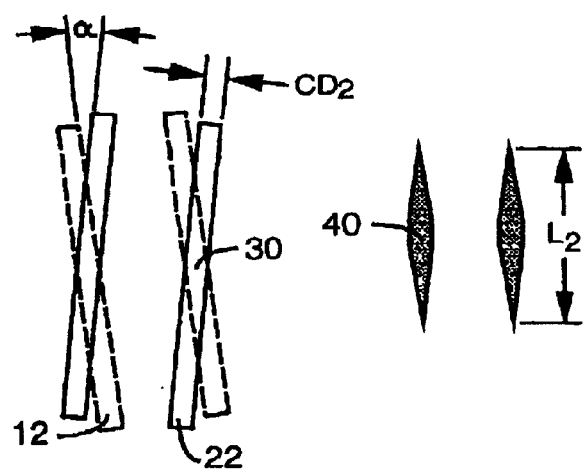
FIG. 2a     FIG. 2b     FIG. 2c
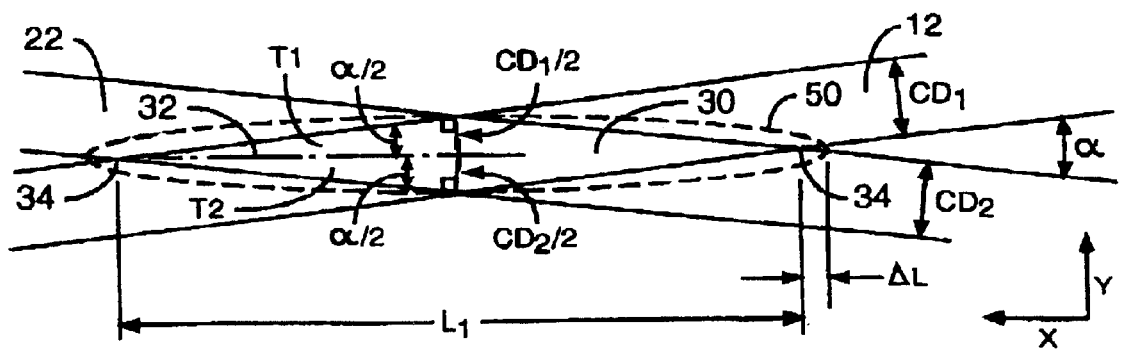
FIG. 3

APPARATUS FOR PREFORMING MEASUREMENT OF A DIMENSION OF A TEST MARK FOR SEMICONDUCTOR PROCESSING

CROSS REFERENCE TO RELATED APPLICATIONS

This application is a continuation of U.S. application Ser. No. 09/615,636, filed Jul. 13, 2000, now U.S. Pat. No. 6,449,031, which in turn is a divisional of U.S. application Ser. No. 09/163,049, filed Sep. 29, 1998, now U.S. Pat. No. 6,094,256.

BACKGROUND

1. Field of the Invention

The present invention relates to lithographic methods and, more particularly to lithographic methods for characterizing and monitoring lithographic exposure tool imaging performance.

2. Description of Related Art

Imaging performance, with respect to a lithographic exposure tool, is generally understood to describe an exposure tool's ability to accurately produce an image of an object. The evaluation of this imaging performance is generally performed first to fully characterize performance over the tool's exposure field and second to monitor tool performance, as part of a process control scheme, when the tool is used to produce images for the manufacture of, for example, an integrated circuit (IC).

For this first task, test pattern reticles or masks have been developed by lithographic tool manufacturers and users that have a number of specially designed test structures placed at a number of locations within the exposure field. An example of such a test pattern having nine groupings of test structures spread over an exposure field is seen, for example, in FIG. 14 of U.S. Pat. No. 4,908,656, issued Mar. 13, 1990 to Suwa et al., which is of different test structures formed therein are designed to enable the evaluation of the different factors that influence imaging performance.

Generally, the evaluation of imaging performance begins by exposing the test pattern at different locations on a substrate using a matrix of exposure conditions, for example as indicated in the exposure time vs. focus matrix depicted in FIG. 17 of Suwa et al. Once this matrix is completed, the various test structures are evaluated for each test pattern. While a variety of criteria are evaluated to fully characterize imaging performance, the measurement of the size of a test structure, referred to as its critical dimension (CD), is among the most important. As these test images are generally quite small, a CD of 0.25 micron ($\mu$m) or less is typical for today's high density ICs, a scanning electron microscope designed for such critical dimension measurements (CD-SEM) is generally used. In this manner, the tool's imaging performance is characterized and a best set of exposure conditions selected.

Once the exposure conditions are selected and the lithographic tool begins to produce images in a manufacturing mode, imaging performance must still be evaluated to ensure that it remains within process control limits. Typically, users monitor imaging performance by measuring the CD of a test structure, developed for this second task, that is placed within the exposure field. In this manner, the test structure is present in each exposure field on the substrate or wafer and can be measured. As known, the number of measurements per wafer and the number of wafers measured per lot, or group of wafers, will vary as a function of the process control scheme employed. As mentioned for characterizing imaging performance, these in-process measurements are also generally performed using a CD-SEM.

However, as the size of the features of integrated circuits continues to shrink, the use of CD-SEMs for measuring critical dimensions becomes problematic for several reasons. First, as feature size becomes smaller, small changes in the size across an exposure field become more critical. For example, while a variation in size of ±0.01 micron ($\mu$m) is only 1% of a 1 $\mu$m feature, it is 10% of a 0.1 $\mu$m feature. As a result, adequately evaluating imaging performance across an exposure field requires that more sites within each field be measured to allow for more critical adjustments to the tool. Thus the 9 sites shown in FIG. 14 of Suwa et al., are more often 15 or 18 sites now. Thus even with a state of the art CD-SEM, the 49 exposure fields in FIG. 17 of Suwa et al. at 18 sites per field adds considerable additional time to an evaluation. As this additional time can require additional measurement tools and as a state of the art CD-SEM is expensive, the purchase of any additional measurement tools can significantly impact manufacturing costs. A third problem is the ability of even state of the art CD-SEMs to resolve the test structures adequately to make accurate measurements as these structure's sizes approach the resolution capability of the CD-SEM. A fourth problem, contamination caused by the electron beam, generally only affects the use of a CD-SEM for in-process measurements. Thus the very nature of bombarding a structure with an electron beam and the resultant secondary emissions that are captured for imaging, can also contaminate devices in the adjacent ICs. As a result, wafers used for in-process measurements as part of a process control scheme, are sometimes discarded or the photoresist layer removed, the wafer cleaned and reprocessed. Either alternative resulting in increased costs and reduced yields. Thus, alternate methods for characterization of imaging performance and in-process monitoring of that performance are needed.

One such alternate method reported to provide improved accuracy over CD-SEM measurements employs an electrical measurement of an array of test structures. The test structures of this method are formed in a conductive layer overlying a special test substrate where the structures have attached contact regions. Thus, a resist layer is exposed and the pattern of test structures developed and etched. After removing the resist layer, the conductivity of the etched features are measured by an electrical means. Using such parameters as the specific electroconductivity of the conductive layer and the length of the etched feature, a linewidth is calculated. This methodology has gained some acceptance characterizing a tool's imaging performance, especially for small CDs. However, as the procedure involves a special substrate having a conductive layer and several processing steps after formation of an image to pattern the conductive layer, it is not suitable for in-process monitoring of imaging performance, and thus is limited in its use to tool characterization. As a result, an alternate method must be employed for in-process monitoring, thus requiring an additional step of determining the relationship between the electrical measurements and in-process monitoring measurements.

Thus it would be desirable to have a method of forming a test structure and method for using that test structure for both full characterization of imaging performance and in-process monitoring. In this manner the procedures that lithographic tool users employ are simplified. In addition, correlation between imaging performance characterization and in-process monitoring is ensured. It would also be desirable for the method of forming the test structures and method of its use provide for more accurate measurements of critical dimensions (CDs) then is currently possible. Additionally, it would be desirable if these methods are applicable for essentially any size CD. Finally, it would be desirable for this method to be cost effective, both in the cost of the processing required to form the test structures and the measuring equipment used to accurately measure those test structures.

SUMMARY

In accordance with the present invention, a method for forming a critical dimension test mark (CDTM) and methods for both characterizing exposure tool imaging performance and in-process image performance monitoring, hereinafter referred to as process control monitoring, using the CDTM formed are provided. The embodiments of the present invention overcome the above and other drawbacks associated with prior art techniques for evaluating and monitoring the imaging performance of exposure tools.

The CDTM of some embodiments of the present invention is a doubly exposed region formed by superimposing a first feature or features on a reticle with a second feature or features on the reticle. In other embodiments of the present invention the first and second feature or features employed are generated from a data base used to drive the exposure tool, for example as in an electron beam direct write exposure system. Advantageously the CDTM of the present invention is formed using an exposure energy that is essentially equal to the energy needed to form a normal, singly exposed image.

The CDTM formed by the method of the present invention provides benefits that overcome the deficiencies of the prior art by essentially magnifying the size of prior art CD structures while maintaining an essentially normal exposure energy for the CDTM. In this manner the CDTM, formed by the methods of the present invention, are used to determine the critical dimension (CD) of a feature, for example a CD test structure in the manner of the prior art, without actually measuring that feature.

Thus in some embodiments of the present invention, first portions of an image forming layer overlying a conventional substrate are exposed with a first exposure energy. A conventional reticle is used having a first feature or features positioned with a first orientation to define the first portions. The first exposure energy is less than the nominal energy needed to fully form a normal, singly exposed image with the same reticle. In some embodiments, this first exposure energy is approximately one-half the nominal exposure energy. Second portions of the image forming layer are then exposed with a second exposure energy. This second exposure defines a second feature or features positioned at a second orientation such that an overlap region of the first and second features is formed. Advantageously, the sum of the first and second exposure energies is approximately equal to the nominal exposure energy. Hence, as only the overlap region is exposed during both the first and second exposures only this region receives sufficient energy to be fully defined in the image forming layer.

In some embodiments in accordance with the present invention, the first feature is repositioned to have the second orientation. In other embodiments, the first and second features are different test features of essentially the same size and shape. In still other embodiments, the first and second features are different test features of essentially the same shape but different size. Generally, the first and second orientations differ only by an angle of rotation about an axis that is within the doubly exposed or overlap region. Thus the overlap region, hereinafter referred to as the critical dimension test mark (CDTM), encompasses a region that has a dimension that magnifies the CD of the first and second feature. This magnification being defined by a relationship that comprehends the CDs of the first and second features, the angle of rotation between the first and second orientation and an empirical constant that includes the effects of the image forming layer and any processing required to define the CDTM within or on that layer.

It will be understood that while embodiments of the present invention have been described with reference to an image forming layer on a substrate, other methods of forming images can be employed and are within the scope of the present invention. For example, in some-embodiments of the present invention an image is formed using a image forming device rather than a layer, for example a charge coupled device array (CCD) or the like can be used to form an image of the CDTM and to characterize exposure tool imaging performance.

Embodiments of the present invention also include methods for using CDTMS formed to determine a critical dimension of a test feature without actually measuring that test feature. In this manner, not only can the imaging performance of an exposure tool over its exposure field be characterized, but also that imaging performance can be monitored while the exposure tool is used in a production mode. Advantageously, since the CDTM formed essentially magnify the CD of a test feature, for example by factors of approximately 10 or more, embodiments of the present invention provide characterization and monitoring data without the need to use an expensive CD-SEM. Rather, an optical apparatus or device, for example an apparatus that scans a laser beam or other optical beam over one or more CDTM's and detects a signal caused by diffraction, reflection or scattering of the scanned beam from the CDTM's can be used to measure the dimension of the CDTM. In some embodiments, the optical device for aligning a fiducial of a projected image from a reticle to a fiducial of a previous layer formed on the substrate is used to measure the dimension of the CDTM. As such optical devices are not typically employed as measurement tools, where such tools are used embodiments of the present invention include a software program to control the measurement process. In some embodiments of the present invention, the diffraction detecting device and control software employed for measuring the CDTM's formed are incorporated within the exposure tool. In some embodiments, the optical measuring tool is a stand alone system.

It will be understood that while embodiments of the present invention have been described with reference to a device for detecting optical signals caused by diffraction from the CDTM of the present invention, other methods for measuring the size of the CDTM of the present invention are also appropriate. For example, in some embodiments of the present invention a measuring system employing a confocal microscope based detector is employed.

BRIEF DESCRIPTION OF THE DRAWINGS

The present invention may be better understood, and its numerous objects, features, and advantages made apparent to those skilled in the art by referencing the accompanying drawings. For simplicity and ease of understanding, common numbering of elements within the illustrations is employed where an element is the same in different drawings.

FIGS. 2a–c depict steps of a method for forming a critical dimension test structures (CDTM) in accordance with an embodiment of the present invention;

FIG. 3 depicts the geometrical relationship that provides the magnification of a CD in accordance with an embodiment of the present invention;

DETAILED DESCRIPTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. For example, while embodiments of the present invention are described herein with respect to being formed in a positive image forming layer, it will be understood that these embodiments are also applicable to a negative image forming layer or an image forming device such as an array of charge couple devices (CCDs) or other solid state image forming apparatus. In addition, while these embodiments are also described with respect to a photolithographic exposure system, it will be understood that other types of exposure systems can be employed. Thus, embodiments of the present invention include electron beam, ion beam and x-ray exposure systems and image forming layers that are sensitive to the type of exposure energy employed. Hence, these descriptions and drawings are not to be considered in a limiting sense as it is understood that the present invention is in no way limited to the embodiments illustrated.

Figure 1:
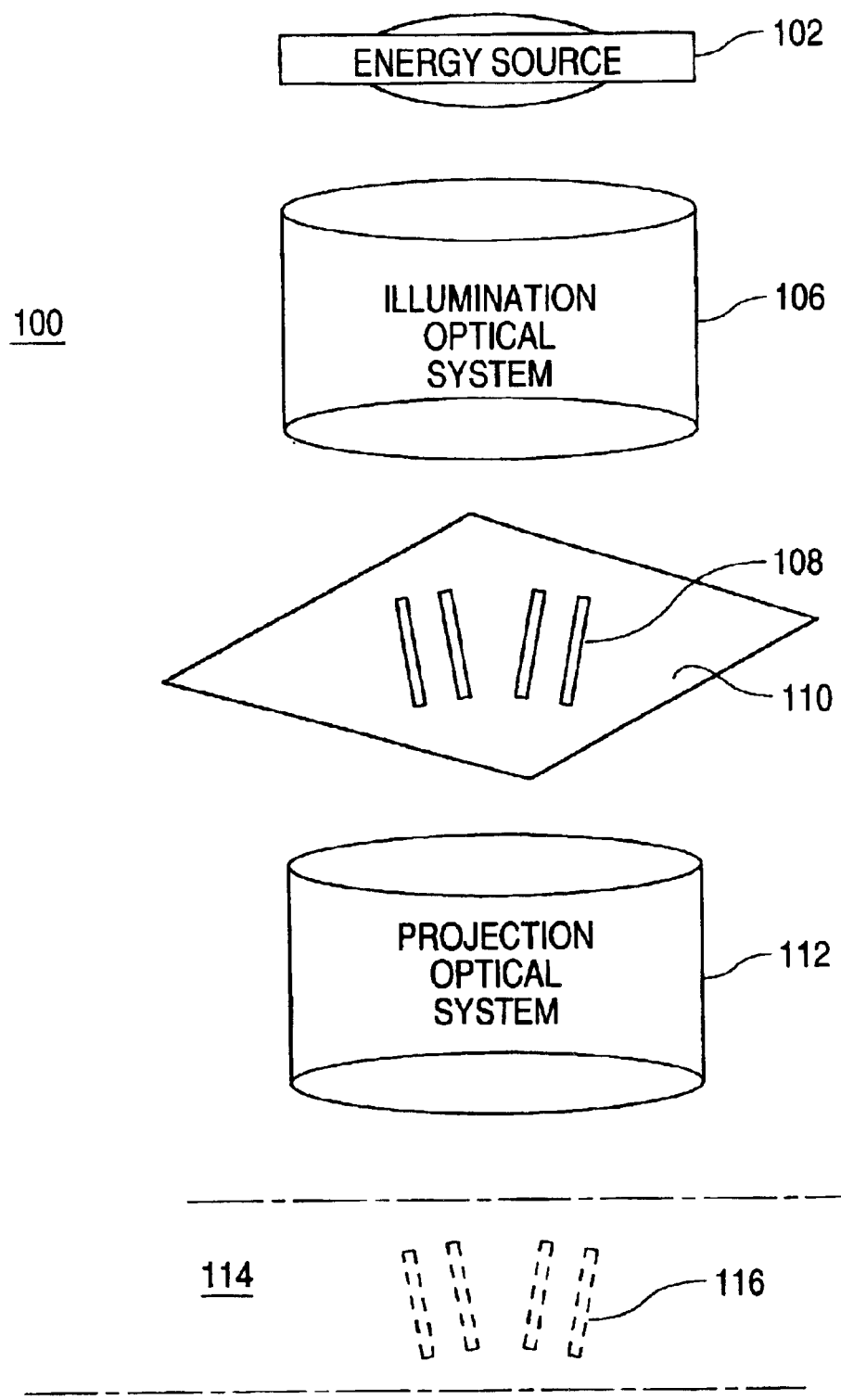
FIG. 1 is a block diagram of a projection exposure system in accordance with embodiments of the present invention.

Referring to FIG. 1, a projection exposure system 100 including an energy source 102 is shown. As those skilled in the art will readily appreciate, energy source 102 can be a high pressure mercury lamp, a krypton fluoride (KrF) laser, an electron beam radiation source or any other suitable energy emitting device, for example an ion beam source. The energy from energy source 102 passes through illumination optical system 106. Illumination optical system 106 collects the energy from energy source 102 and directs that energy in a regular manner through a reticle or mask 110. While illumination optical system 106 is depicted in FIG. 1 in block form, it will be understood that this is for illustrative reasons only, and that optical system 106 encompasses whatever suitable optical element that are necessary. For example, where energy source 102 is a high pressure mercury lamp, illumination optical system 106 includes a lens structure or mirror optical system. Alternatively, where energy source 102 is an electron beam source, system 106 includes electromagnetic lenses.

Reticle 110 is positioned at the object plane of projection exposure system 100. As known, energy used to define an object, for example object 108, is directed through the object and then projected through projection optical system 112 to form an image 116 at an image plane 114 of exposure system 100. Image 116 being representative of object 108. Thus where an image forming device or layer (not shown) is positioned at image plane 114, image 116 is formed thereon.

Projection optical system 112 encompasses whatever suitable optical elements as are necessary to project an image of object 108 onto image plane 114. Thus, where energy source 102 is a KrF laser, projection system 112 includes a multiple element lens. Alternatively, where energy source 102 is an ion beam source, projection system 112 includes a plurality of electromagnetic lenses.

While embodiments of the present invention employ projection exposure systems, such as system 100, that are known, these embodiments use such systems in a new manner. Thus, turning now to FIGS. 2a–2c, the several steps to form arrays of critical dimension test marks 40 (CDTM) in the manner of an embodiment of the present invention is depicted in an illustrative manner. Each of the CDTM's represented in FIG. 2c will be understood to depict "ideal" CDTMs, that is to say that CDTMs as they would theoretically be formed at the image plane of an exposure system (not shown) without comprehending any of the effects due to the various subsystems of the exposure tool, the image forming layer or device and the method of fixing the image in that layer or device.

In FIG. 2a, a first test structure 10 is depicted as a closely spaced array of ideal first CD bars 12 having a close spacing 14, wherein the width of each bar 12, $CD_1$, is essentially equal to close spacing 14. Also shown is a second test structure 20. Structure 20 is depicted as a widely spaced array of ideal first CD bars 12 having a wide spacing 16, where the width of bars 12 is again $CD_1$ and the width of wide spacing 16 is typically at least 5 times larger than that of CD bar 12. First structure 10 is representative of what is known in the art as a densely packed CD bar structure 10 and first structure 20 is representative of what is known in the art as an isolated CD bar structure 20. Generally both dense CD bar structures 10 and isolated CD bar structures 20 are used to characterize imaging performance, as CD measurements are known to vary between such structures. (See, Christopher J. Progler and William L. Krisa, *Understanding the Effect of Pitch on Linewidth Control*, Proceedings Olin Microlithography Seminar, October 1996, p. 141–157) In addition, while only essentially vertical CD structures are depicted in FIGS. 2a–2c, generally other CD structures oriented perpendicular to the structures depicted are also formed and measured for characterization and monitoring purposes. It should be readily apparent then, that for any given dimension $CD_1$ structures 10 and 20 will differ in the number of CD bars 12 and the size of the space between adjacent bars. For example, where both dense structure 10 and isolated structure 20 are 4 microns ($\mu$m) wide, and CD bars 12 are nominally 250 nanometers (nm) wide, densely packed structure 10 has eight CD bars 12 and seven spaces 14; isolated bar structure 20 has three CD bars 12 and two spaces 16.

Referring again to FIG. 2a, ideal images of both dense CD structure 10 and isolated CD structure 20 are formed, in accordance with the present invention, by exposing CD bars 12 in a first exposure. Typically, a first exposure energy of approximately one-half the required energy for a fully formed image is employed, although other appropriate energies can be employed. In FIG. 2b, second ideal images of an array of CD bars 22, having a width $CD_2$, are formed. Each second ideal image overlies at least a portion of the first ideal images and are positioned rotated with respect to CD bars 12 of the first image by an angle $\alpha$. Advantageously, an axis of rotation (not shown) is selected such that each bar 22 overlaps each bar 12 thus forming an array of overlap regions 30 for each CD structure 10 and 20. These CD bar structures are exposed in a second exposure with a second energy equal to the required energy for a fully formed image less the energy of the first exposure. As only these overlap regions 30 are exposed in both the first and second exposure, only these regions receive an amount of energy required to fully form an ideal image. It will be realized that as the remaining portions of CD bars 12 and 22 receive only the first or second exposure energy these remaining portions do not receive sufficient energy to fully form an image. In some embodiments of the present invention CD bars 12 are shifted to be used for the second exposure. Thus CD bars 12 and 22 are the same bars and widths $CD_1$ and $CD_2$ have the same value. In some embodiments, different CD bars 12 and 22 are employed, but with each having the same target CD value, therefore widths $CD_1$ and $CD_2$ are similar. However, in some embodiments of the present invention, CD bars 12 and 22 advantageously have different dimensions, as will be discussed.

Referring now to FIG. 2c, an array of ideal critical dimension test marks 40 (CDTM) are shown for each ideal CD test structure 10 and 20. Each CDTM 40 corresponds to an overlap region 30 of FIG. 2b. In addition, each ideal CDTM has a length, $L_1$ for dense structure 10 and $L_2$ for isolated structure 20. It should be readily apparent that both $L_1$ and $L_2$ are much larger than either $CD_1$ or $CD_2$.

Turning now to FIG. 3, an enlarged representation of an ideal overlap region 30, or CDTM 40 (FIG. 2c) is depicted to illustrate the relationship between $CD_1$ and/or $CD_2$ to the length L of that region. CD bar 12 is exposed at a first energy and CD bar 22 is exposed at a second energy as previously described. To achieve the structure depicted, CD bar 22 is oriented such that it is rotated with respect to CD bar 12 and overlaps bar 12 to form overlap region 30 or CDTM 40. CD bars 12 and 22 cross one another at points 34, length L thus being the distance between the crossing points 34. It is readily apparent that, advantageously, the distance L is not affected were CD bar 12 or CD bar 22 is displaced in the X or Y direction. Rather, length L is dependent only on the width of each bar, $CD_1$ and $CD_2$, and the angle $\alpha$.

Right triangles T1 and T2, are formed by line 32, bisecting angle $\alpha$, lines $CD_1/2$ or $CD_2/2$ respectively, and an edge of the respective CD bar. Using these triangles, it is seen that the length L of overlap region 30 (or CDTM 40) can be expressed as:

$$L = \frac{CD}{\sin(\alpha/2)} \qquad \text{Equation 1}$$

where

L is the length of a CDTM;

CD is the average of $CD_1$ and $CD_2$; and $\alpha$ is the angle of rotation between bars 12 and 22.

However, this ideal image of overlap portion 30, or CDTM 40 (FIG. 2c), is not the real CDTM formed in an image forming layer or device. Rather, it has been found that a real image 50 is longer than this ideal image. This increase in length resulting from, among other things, diffraction effects during the exposure that cause a spreading of sharp points, as are formed at crossing points 34. Thus the length of real image 50 is equal to L+2$\Delta$L. It has been advantageously found, however, that this increase in L can be evaluated empirically and a constant determined that can be applied to Equation 1 to give:

$$L = \frac{k_{il} \times CD}{\sin(\alpha/2)} \qquad \text{Equation 2}$$

where $k_{il}$ is an empirical constant that comprehends the image lengthening effects due to the various subsystems of the exposure tool, the image forming layer or device and the method of fixing the image in that layer or device.

The inventors have advantageously found that the relationship of Equation 2 is consistent over a range of different image forming layers and devices, for example I-line photoresists and chemically enhanced Deep-UV photoresist materials, and exposure tools and conditions of exposure, where the constant $k_{il}$ is evaluated for each system of exposure and image forming layer or device.

As can be seen from Equations 1 and 2, L varies inversely with $\alpha$, thus as $\alpha$ is decreased, L increases. For example in Equation 1, where $CD_1$ and $CD_2$ are each 200 nanometers (nm) (the average CD is then also 200 nm) and a is 10 degrees (°), L is 2.3 $\mu$m, or a value for the average of $CD_1$ and $CD_2$ that is about 11.5 times larger than the either actual CD. Reducing $\alpha$ to 5° increases L to 4.6 $\mu$m which is now about 23 times larger than the CDs of the CD bars used to form the CDTM. This magnification is significant, as where a CD bar having a CD of 200 nm would require a CD-SEM to effect a measurement, having a much larger L, for example 2 $\mu$m or more, allows alternative measurement tools to be used.

Figure 4:
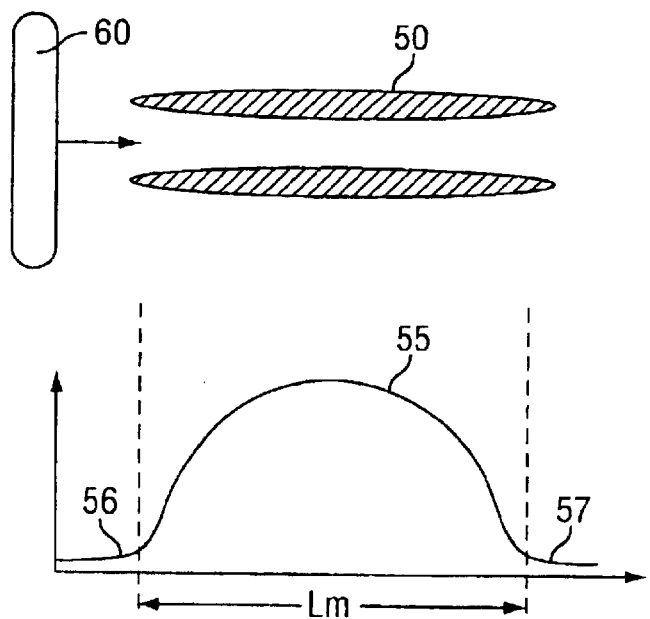
FIG. 4 depicts a method of measuring a CDTM of the present invention in accordance with an embodiment of the present invention and a simulated output signal therefrom.

Thus now referring to FIG. 4, a method of measuring the length L of a CDTM of the present invention is illustrated. A light beam 60 is scanned in the X-direction across one or more CDTMs 50 on a substrate (not shown) and light reflected, scattered and/or diffracted by CDTMs 50 collected. As shown, the intensity of this collected light is represented by line 55. Thus before beam 60 reaches CDTM's 50, little or no light is reflected, scattered or diffracted by the substrate. However, as beam 60 reaches CDTMs 60, the intensity of the reflected, scattered and/or diffracted light increases as seen at point 56. As beam 60 passes over CDTMs 60 the intensity depicted by line 55 reaches a maximum value and then decreases. At point 57, beam 60 is beyond CDTMs 50. Thus the measured distance $L_m$ between points 56 and 57 is the length of the CDTMs 50.

The method depicted by FIG. 4 can use a variety of sources for beam 60 and a variety of detectors to measure the intensity 55 of the light scattered and or diffracted by CDTMs 50. For example, in some embodiments of the present invention a laser light source and photomultiplier detection devices are employed. In other embodiments, other methods of measuring CDTMs 50 can be used, for example a scanning confocal microscope based measuring device can also be employed. In some embodiments of the present invention an exposure tool's diffracted light based alignment system is employed to measure CDTMs 50. It should be realized that where an alternate measuring system is used, the system may have to be modified to directly report a CD value rather than a value for the length L of the CDTM actually measured. Therefore, where such direct reporting of a CD value is desired, software, hardware or some combination of software and hardware is employed with the selected measurement system to provide for the use of the relationship of Equation 2, solved for CD, to calculate the CD from the measured length L.

Figure 5:
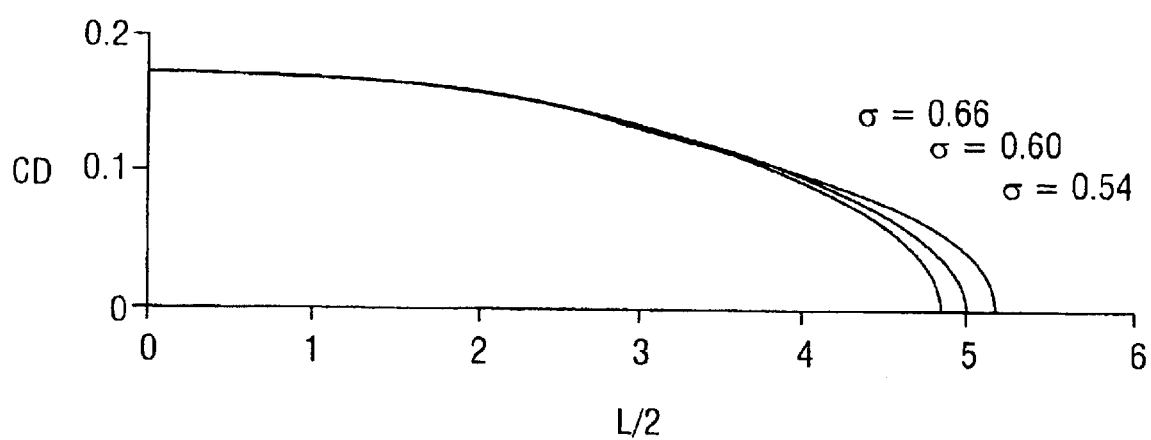
FIG. 5 is a plot, at different values for the coherence factor, of simulated critical dimension values versus the simulated length of an image of a CDTM formed in accordance with embodiments of the present invention.

Turning now to FIG. 5, a simulation of CD versus L/2 of a CDTM, formed in accordance with embodiments of the present invention, is shown for differing exposure conditions. CD bar test structures having a nominal CD of 350 nm are overlaid at an angle of rotation a of two degrees and exposed at best focus with partial coherence factors (σ) of 0.54, 0.60 and 0.66. As shown, as the value for σ decreases, L/2 increases for the same CD. Thus by incorporating a into the empirical constant $k_{il}$ of Equation 3:

$$k_{il} \times CD = L \sin(\alpha/2) \qquad \text{Equation 3}$$

Figure 6:
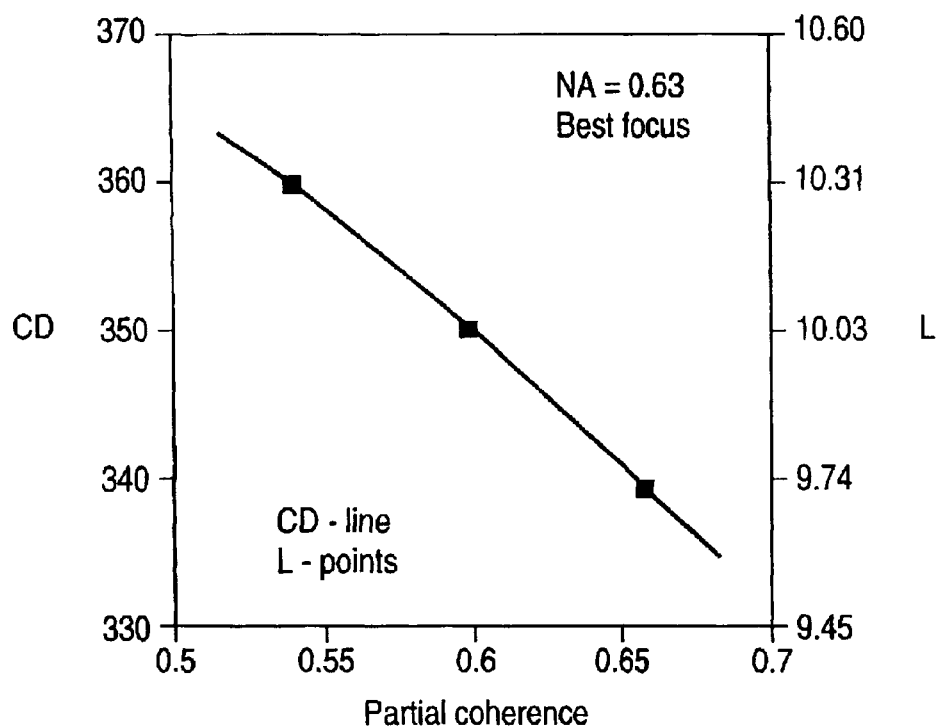
FIG. 6 is the data of FIG. 7 replotted to illustrate the excellent agreement between the length of the CDTM and width of CD bars, from which the CDTM is formed, over the range of partial coherence factors.

CD values can be determined from the length of a CDTM. In FIG. 6, the data of FIG. 5 is replotted to better illustrate the excellent agreement between the length of the CDTM and the value of the CD over the range of partial coherence factors used. As indicated, CD values are represented by the line and values for L by the points.

Figure 7:
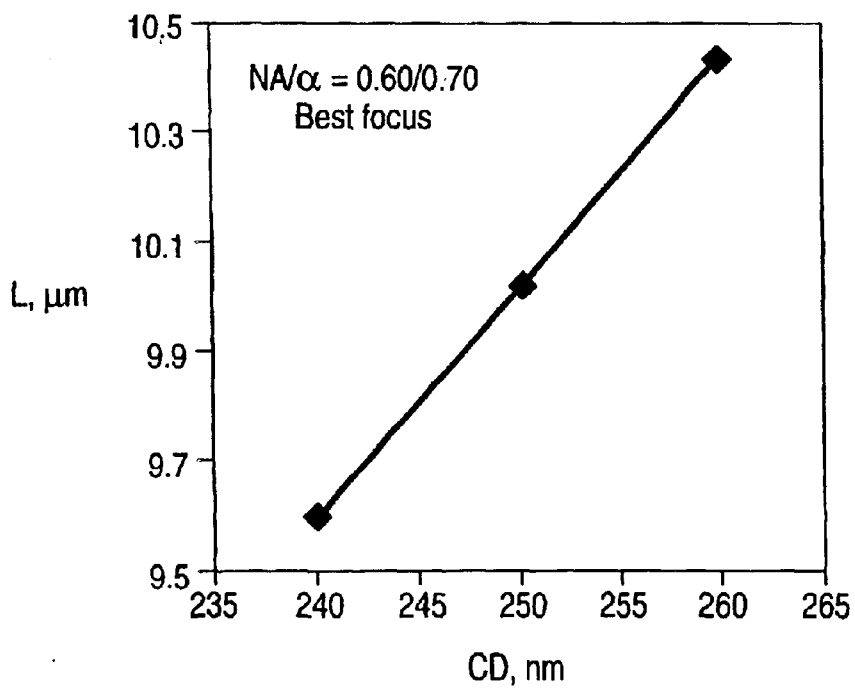
FIG. 7 is a plot of simulated values that illustrate the magnification effect obtained by forming CDTM's in accordance with embodiments of the present invention.

FIG. 7 is illustrative of the magnification effect obtained by forming CDTM's in accordance with embodiments of the present invention. Thus for a CDTM formed using CD bars with a nominal CD of 250 nm that are oriented with respect to one another at an angle of rotation equal to approximately 1.4° in accordance with embodiments of the present invention, a magnification factor of approximately 40 is achieved (10000/250=40). Advantageously, the chart of FIG. 7 shows this magnification relationship to be linear, thus enhancing its usefulness. Hence whether the target CD value for CD bars is 100 nm or 500 nm, a CDTM can be formed having a length L many times larger than the target CD. And as a result of the relationship between length L and CD, as expressed by Equation 3, measuring length L of the CDTM will provide for the calculation of an accurate value for the CD.

It will be understood that the advantages of using the CDTM of the present invention are more than merely being able to use optical measurement devices to take advantage of their relatively low cost and high measurement speed. Additionally, significantly better precision than possible for a SEM CD system can also be achieved. Thus, the 5 nm resolution of a typical SEM CD apparatus represents 2% of a CD bar having a 250 nm nominal value, whereas the 25 to 50 nm resolution possible with, for example a scanning diffraction detection system, is less than 1% of a 10 μm CDTM. In addition, by varying the applicable magnification factor employed to form the CDTM, an essentially uniform sized CDTM can be obtained regardless of the actual CD value desired. In this manner, measurements of the CDTMs formed can be more readily automated to save time and expense. In addition, the precision of the of the measurement tool can be maximized by selecting a CDTM having the best possible length L for the particular system selected.

Figure 8:
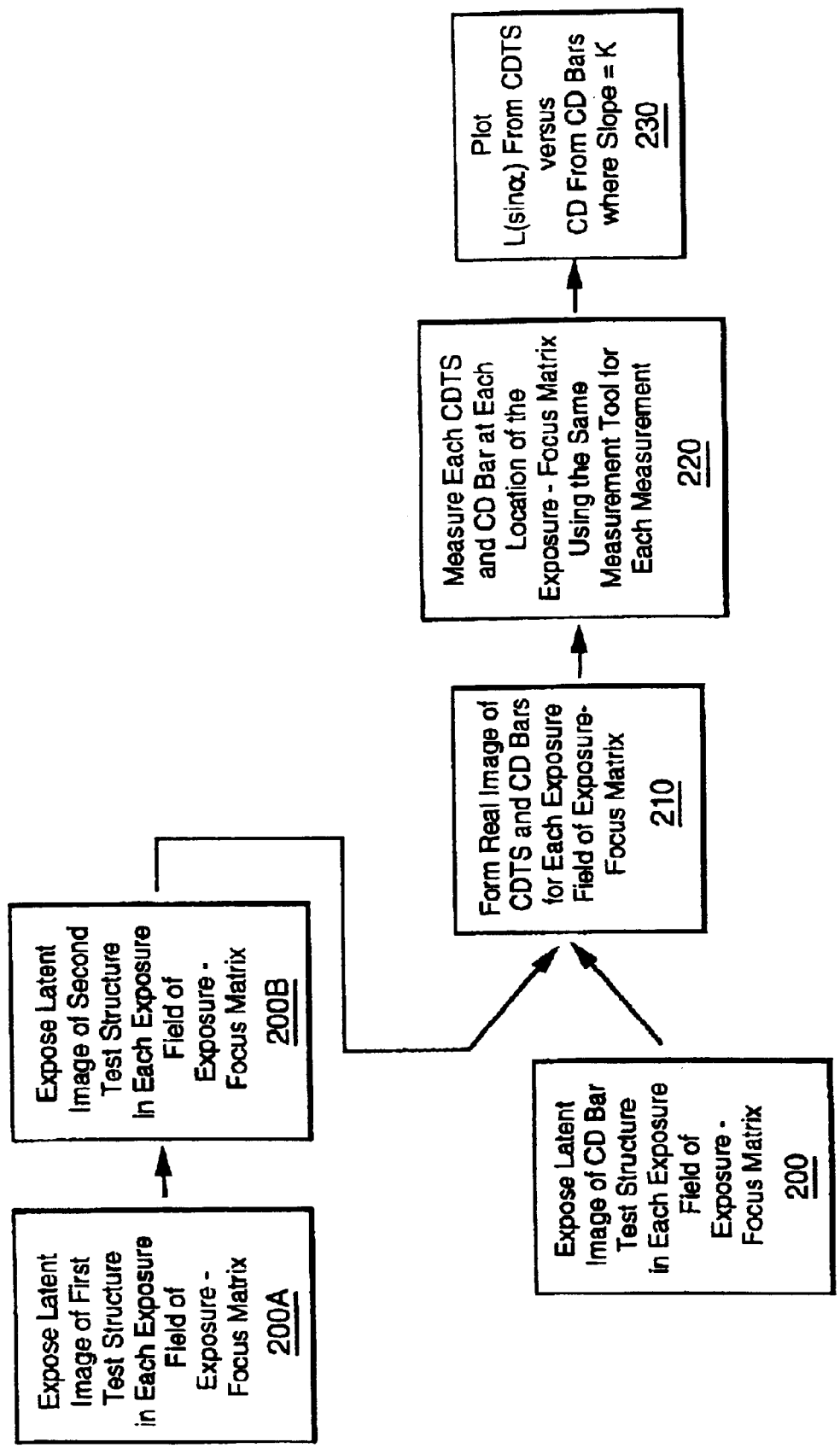
FIG. 8 is a flow chart depicting a method for defining an empirical constant in accordance with an embodiment of the present invention.

Referring now to FIG. 8 a method for determining the value of the empirical constant in accordance with embodiments of the present invention is depicted. It should be realized, that the evaluation of $k_{il}$ for any system requires that all marks, CD as well as CDTM marks are measured using the same measurement tool. As typically the CD bars will have target values of about 350 nm or less, a CD-SEM or other measurement system having resolution in the 3 to 5 nm range will generally be needed for all measurements. Steps 200A and 200B form CDTMs in accordance with the previously described methods. However, rather than a single CDTM or single array of CDTMs at a single exposure condition, an exposure energy versus focus matrix of CDTMs is formed, each CDTM having the same known angle α. For example as described in Suwa et al. with respect to FIG. 17. Thus seven values for exposure energy and seven values for focus position will be used to form a matrix of 49 exposures, each with a unique set of exposure conditions. In step 200, the same exposure energy versus focus position matrix is made, except that actual CD bars are used and CDTMS are not made. While in some embodiments, both the CDTM matrix and the CD bar matrix are formed on a single substrate, generally two substrates having essentially identical image forming layers disposed thereon are used.

Figure 9A:
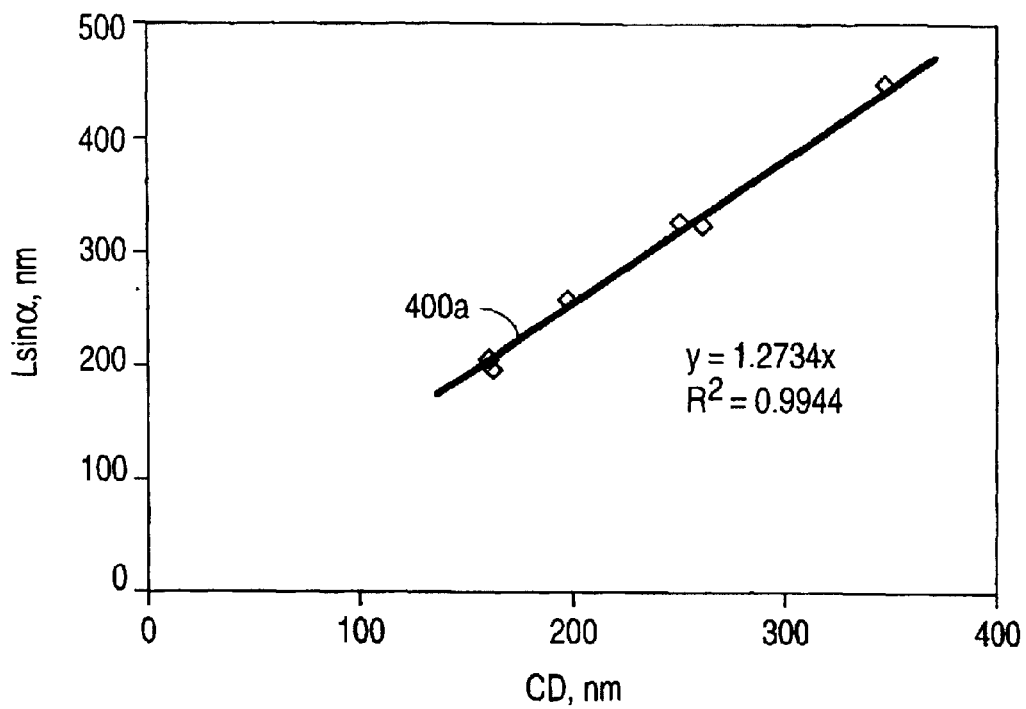
FIGS. 9a and 9b are plots used to define the empirical constant in accordance with embodiments of the method of FIG. 8.
Figure 9B:
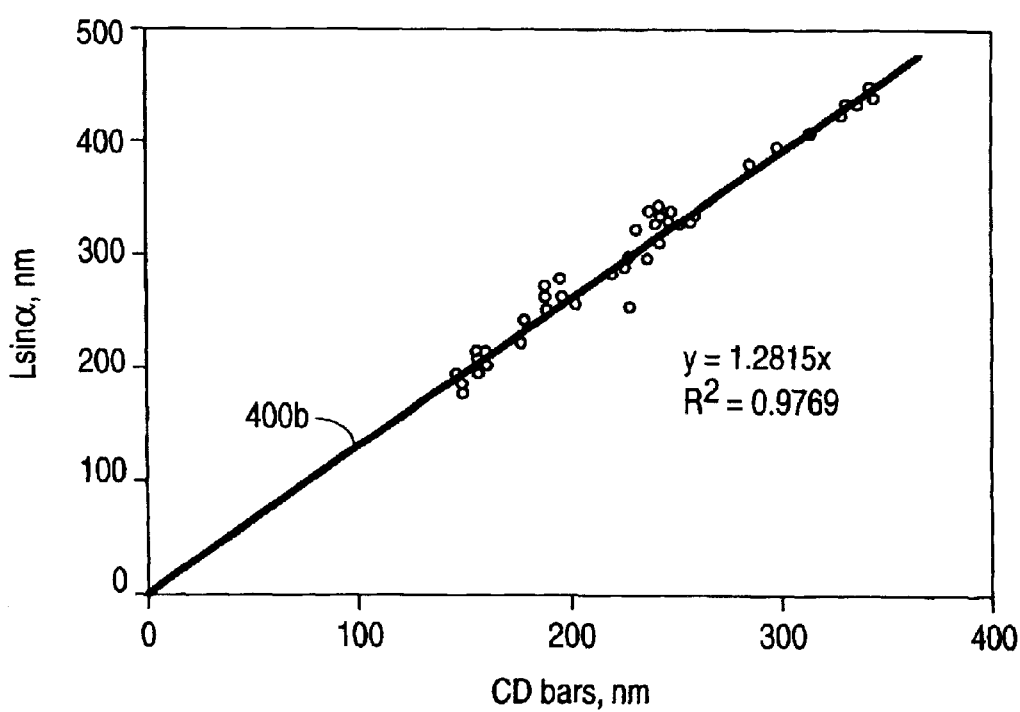

In step 210, real or actual images are formed. For example, where the image forming layer is a positive photoresist layer, each exposed substrate will be developed and the images of CDTMs and CD bars formed. Once formed, CD bars or CDTMs in each of the exposure fields are measured, step 220, and the values obtained used to form a seven by seven matrix of values for the CDTMs and CD bars. The values measured for the CDTMs will be the length of the marks, L, while the values measured for the CD bars will be the width of the bars or CD. Once each matrix is complete, one row, column or diagonal from the CDTM matrix is selected, generally with values having the best focus position, and the product of these values and sin (α) plotted, step 230, against CD values from the equivalent row, column or diagonal of the CD bar matrix. The slope of the best fit line to the points plotted is $k_{il}$. FIG. 9a is an example of such a plot. Thus the values used to produce the plot of FIG. 9a are actual values at different exposure energies and best focus for Lsin (α) and CD, where L and CD are measured using the same CD-SEM. As indicated, the slope of the best fit line 400a is 1.2734 and therefore represents the empirical constant $k_{il}$ for the particular system used. The high degree of correlation between the points is indicated by the correlation factor $R^2$, which is shown to be 0.9944. As known, a perfect correlation would have $R^2=1.0000$. In FIG. 9b, a similar graph to FIG. 9a is shown where all values measured in step 220 (FIG. 8) are plotted. As it can be seen, there is an excellent correlation between L and CD over this range of focus positions and exposure energies with R=0.9769 and a change in $k_{il}$ of less than 1%. Thus it should be apparent that CDTMs, in accordance with embodiments of the present invention, can be employed to characterize imaging performance.

Figure 10A:
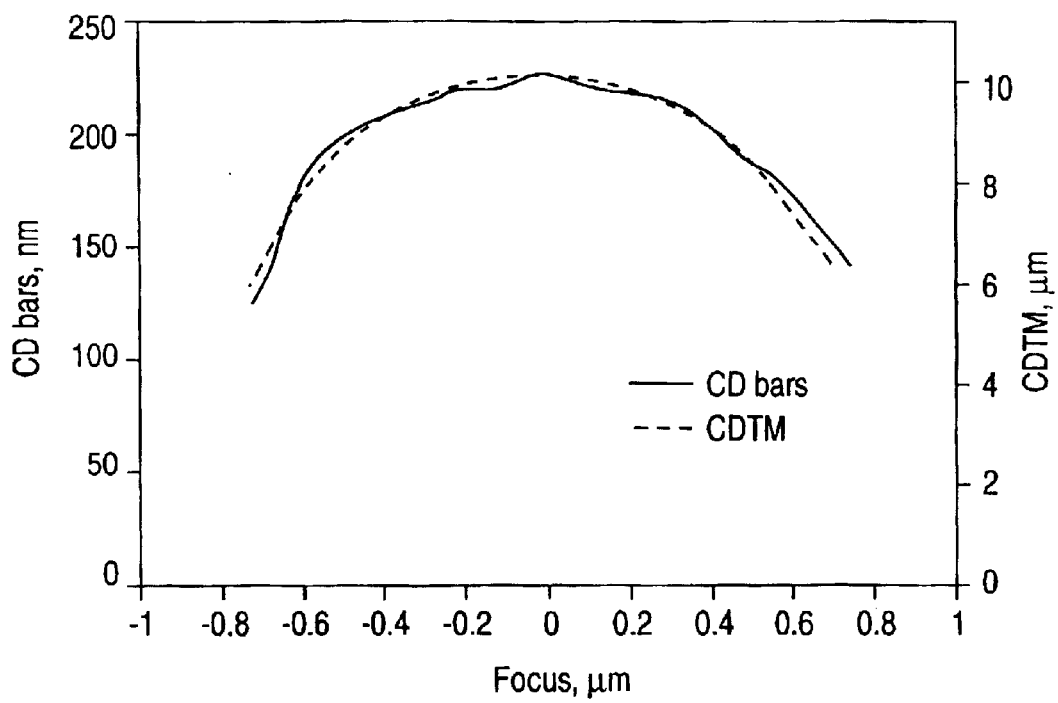
FIGS. 10a and 10b are graphs of actual measurements of CD bars versus a CDTM, formed in accordance with an embodiment of the present invention, at various focus positions.
Figure 10B:
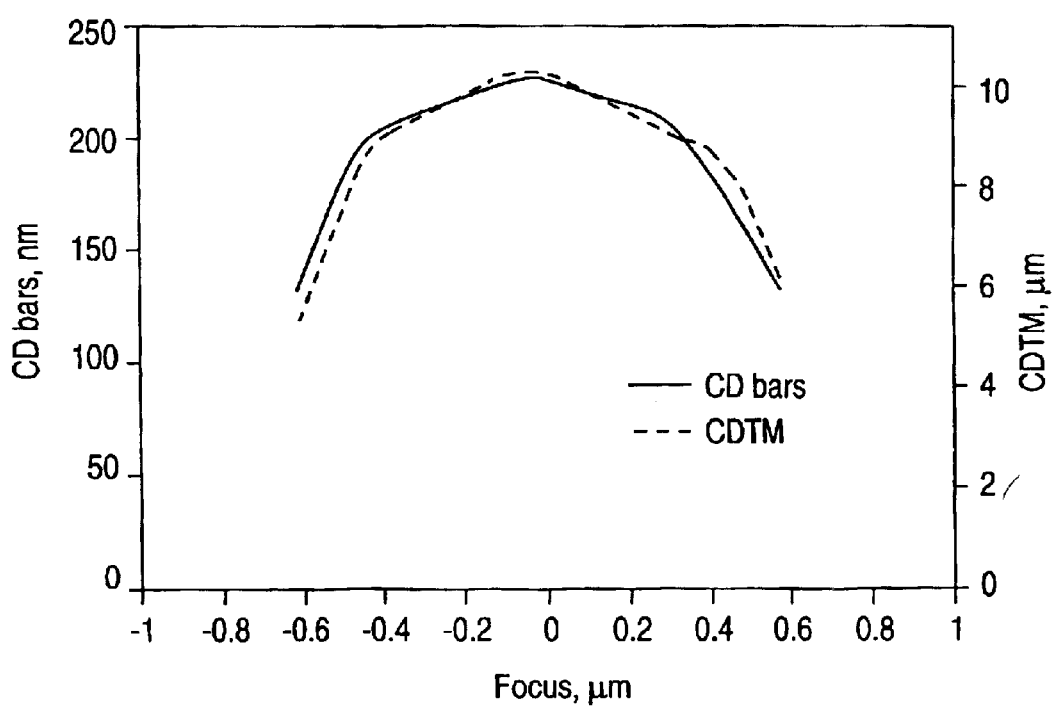

To further demonstrate the accuracy of the CDTMs formed in accordance with embodiments of the present invention for small target CD values, substrates are exposed using a best exposure energy at a variety of focus positions. In each exposure field, both CDTMs and CD bars are formed, each in an appropriate manner. FIGS. 10a and 10b are plots of actual values for the CD of CD bars measured with a CD-SEM and CDTMs measured with an optical tool, as described in FIG. 4. As indicated, the solid line represents the CD bar measurements and the dashed line represents the length L of the CDTMS. In FIG. 1a excellent agreement between CD bars with a targeted CD value of 220 nm and CDTMs at each focus position. In FIG. 10b, where the target CD for the CD bars is 170 nm, again the values obtained for the CDTM at each focus position are in excellent agreement with the CD measured with a CD-SEM.

Thus it should be realized that methods for forming critical dimension test marks or CDTMs have been presented. In addition, it should be realized that methods for-measuring the length of these marks and relating that length to the width or critical dimension of CD bar structures have also been presented. Also, the various plots of simulated and actual values obtained for the length L of a CDTM and the CD of a CD bar demonstrate the excellent correlation between L and CD. Therefore it should be readily apparent to a skilled practitioner of the art that the CDTMs of the present invention provide a method for "measuring" a CD value without the need of expensive, high resolution measuring tools such as a CD-SEM.

As the length or L of CDTMs made in accordance with embodiments of the present invention can be measured using low cost, rapid optical measurement systems, it will also be readily apparent that these CDTMs also provide a method for determining CD values rapidly and at both a low capitalization cost and a low operating cost. Advantageously, such optical measurement system, for example diffraction detecting systems or confocal microscope based systems are not only less costly and faster than CD-SEMs or other similar systems, but can also provide measurement data with greater precision and accuracy due to the magnification factor as previously described. In addition, as CDTMs in accordance with the present invention can be formed in scribe grid or other areas of production wafers, these CDTMs can be utilized for in-process measurements, such as are useful for a process control method as is known. Where the CDTMs of the present invention are used for in-process measurements, the further advantage of an essentially non-contaminating measurement method is provided. This in contrast to CD-SEM measurements which often result in contamination due to the effect of the electron beam on materials such as positive photoresist.

Another advantage of the CDTMs of the present invention results from the calculated CD value representing an average CD for the bars of the first and second exposure. As known, a focus position versus exposure energy matrix is difficult to produce for CD bars having very small critical dimensions, for example CDs below about 200 nm, because the depth of focus of existing exposure systems is too small to provide meaning data for such small CDs. Therefore, characterization and in-process monitoring is at best difficult. However, as CDTMs in accordance with the present invention provide a mark having an average of two CDs, $CD_1$ and $CD_2$ (see FIG. 3), by using a relatively large CD with a very small CD, meaning full characterization and in-process monitoring data can be obtained. Thus where $CD_1$ is 150 nm and a $CD_2$ of 350 nm is selected to provide an average CD of 250 nm for a first CDTM. A second CDTM is also formed where both $CD_1$ and $CD_2$ are 350 nm. Where exposure tool characterization is desired, an exposure versus focus matrix is prepared where both the first and second CDTM is in each exposure field. As the average CD for the first CDTM is 250 nm, the depth of focus problem associated with the desired 150 nm CD bar is reduced or eliminated. CD values are calculated for each of the first and second CDTMs and the results of second CDTM mathematically removed from the results of the first CDTM. In this manner, tool imaging performance for a 150 nm CD bar is obtained. In a similar manner, in-process monitoring of very small CDs can be performed where other methods do not produce reliable, reproducible data.

It will also be readily apparent that the same CDTM structure can be used for both exposure tool characterization and in-process monitoring for process control. Thus unlike electrical CD measurement methods, correlation between characterization results and in-process measurements is assured. In addition, it will be readily apparent that these results are obtained with a minimum of additional process complexity as only a double exposure of the images of standard CD structures as described previously is required to form CDTMs in accordance with the present invention. Those of ordinary skill in the art will realize that changing exposure energy and image orientation are readily accomplished using any of the commonly employed lithographic systems.

While embodiments of the present invention have been shown and described, it will be obvious to those skilled in the art that changes and modifications to these illustrative embodiments can be made without departing from the present invention in its broader aspects. Thus it should be evident that there are other embodiments of this invention which, while not expressly described above, are within the scope and spirit of the present invention. For example, while the illustrations employed where for photolithographic systems, other lithographic systems such as electron beam lithography, ion beam lithography and the like can also take advantage of the benefits of the present invention. Therefore, it will be understood that the appended claims necessarily encompass all such changes and modifications as fall within the described invention's true scope and spirit. Further, that this scope and spirit is not limited merely to the illustrative embodiments presented to demonstrate that scope and spirit.

We claim:

1. An apparatus comprising:
    a measurement element configured to measure a dimension of a test mark formed by overlapping features imaged onto an image forming layer of a semiconductor wafer; and
    a computation arrangement to calculate a critical dimension of the overlapping features of the test mark from the measured dimension, the computation including:
        an empirical constant that compensates for image distortion effects caused by at least one of the image forming layer and the measurement element.

2. The apparatus of claim 1, wherein the dimension is the length of the test mark.

3. The apparatus of claim 1, further comprising a scanning element configured to cause the measurement element to scan light onto the test mark.

4. The apparatus of claim 3, wherein the measurement element is configured to measure the dimension of the test mark by measuring the intensity of the light scattered or diffracted from the test mark.

5. The apparatus of claim 4, wherein the measurement element is further configured to measure the dimension of the test mark by comparing the intensity of the light scattered or diffracted from the test mark with a first predetermined threshold which is indicative of the start point of the dimension and with a second predetermined threshold which is indicative of an end point of the dimension.

6. The apparatus of claim 1, wherein the computation arrangement computes the critical dimension using the equation:

$$\text{critical dimension} = (L*\sin(\alpha/2))$$

where α is the angle between the overlapping features, and

L is the measured dimension length of the test mark.

7. The apparatus of claim 6, wherein the empirical constant compensates for image distortion effects using the equation:

$$\text{critical dimension} = (L*\sin(\alpha/2))/k$$

where k is an experimentally determined constant.

8. The apparatus of claim 1, wherein the apparatus is a lithography machine.

9. The apparatus of claim 1, wherein the apparatus is a microscope.

10. The apparatus of claim 1, wherein the measurement element further comprises a light source and a photo detection device.

11. The apparatus of claim 10, wherein the photo detection device is a charge coupled device (CCD).

12. The apparatus of claim 1, wherein the critical dimension is the average line width of the two overlapping features.

13. An apparatus comprising:
a measurement element configured to measure a dimension of a test mark formed by overlapping features imaged onto an image forming layer on a semiconductor layer; and an arrangement to empirically determine a constant, $k_{il}$, for reporting a critical dimension, CD, in response to said dimension of said test mark as measured by said measurement element and $k_{il}$.

14. The apparatus as recited in claim 13, wherein said dimension is a length of said test mark.

15. The apparatus as recited in claim 13, wherein said measurement element is scanned across said test mark.

16. The apparatus of claim 15, wherein said measurement element provides for measurement of said dimension by measurement of intensity of light reflected from said test mark.

17. The apparatus of claim 16, wherein said measurement of intensity of light is compared to a threshold to determine a start point and an end point of said measurement.

18. The apparatus as recited in claim 13, wherein said critical dimension is determined in accordance with the equation $CD = (L \sin(\alpha/2))/k_{il}$ where α is an angle between said overlapping features.

19. The apparatus as recited in claim 18, wherein $k_{il}$ compensates for image distortion effects in the formation of said test mark.

20. The apparatus as recited in claim 13, wherein said apparatus is a lithography tool.

21. The apparatus as recited in claim 13, wherein said apparatus is a microscope.

22. The apparatus as recited in claim 13, wherein said measurement element comprises a light source and a photodetection device.

23. The apparatus as recited in claim 22, wherein said photo detection device is a charge coupled device (CCD).

24. The apparatus as recited in claim 13, wherein said critical dimension is an average line width of said two overlapping features.

25. Software stored on a computer readable medium which, when run on a processor, provides control of apparatus to perform steps of measurement of a dimension of a test mark formed by overlapping features imaged onto an image forming layer on a semiconductor layer; and reporting a critical dimension, CD, in response to said dimension of said test mark as measured by said measurement element and $k_{il}$, where $k_{il}$ is an empirically determined constant.

26. The software as recited in claim 25, wherein said dimension is a length of said test mark.

27. The software as recited in claim 25, wherein said computer code causes said apparatus to perform a further step of scanning light onto said test mark.

28. The software as recited in claim 27, wherein said measurement is made responsive to intensity of said light reflected from said test mark.

29. The software as recited in claim 28, wherein said intensity of said light reflected from said test mark is compared with a threshold to determine a start point and an end point of said test mark.

30. The software as recited in claim 25, wherein said critical dimension is determined in accordance with the equation $CD = (L \sin(\alpha/2))/k_{il}$ where α is an angle between said overlapping features.

31. The software as recited in claim 30, wherein $k_{il}$ compensates for image distortion effects in the formation of said test mark.

32. The software as recited in claim 30, wherein said critical dimension is an average line width of said overlapping features.

* * * * *